United States Patent
Kobayashi

(10) Patent No.: US 8,035,033 B2
(45) Date of Patent: Oct. 11, 2011

(54) WIRING SUBSTRATE WITH PLURALITY OF WIRING AND INSULATING LAYERS WITH A SOLDER RESIST LAYER COVERING A WIRING LAYER ON THE OUTSIDE OF OUTER INSULATING LAYER BUT EXPOSING THE HOLES IN THE OUTER INSULATING LAYER

(75) Inventor: Kazutaka Kobayashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 391 days.

(21) Appl. No.: 12/372,158

(22) Filed: Feb. 17, 2009

(65) Prior Publication Data
US 2009/0205860 A1    Aug. 20, 2009

(30) Foreign Application Priority Data
Feb. 18, 2008    (JP) .................................. 2008-036234

(51) Int. Cl.
*H05K 1/00*    (2006.01)
(52) U.S. Cl. ......................................... 174/250

(58) Field of Classification Search .................. 174/250, 174/257, 260; 257/700; 228/225
See application file for complete search history.

(56) References Cited

U.S. PATENT DOCUMENTS

| 7,365,272 | B2* | 4/2008 | Hsu et al. ........................ 174/250 |
| 7,838,982 | B2* | 11/2010 | Nakamura ..................... 257/700 |
| 2002/0084314 | A1* | 7/2002 | Kim et al. ...................... 228/225 |
| 2005/0087364 | A1* | 4/2005 | Umemoto ....................... 174/260 |
| 2006/0131730 | A1* | 6/2006 | Nakamura ..................... 257/700 |
| 2009/0020323 | A1* | 1/2009 | Chen et al. ..................... 174/257 |
| 2011/0034022 | A1* | 2/2011 | Nakamura ..................... 438/613 |
| 2011/0042128 | A1* | 2/2011 | Hsu ................................ 174/257 |

FOREIGN PATENT DOCUMENTS
JP        2003-86735       3/2003

* cited by examiner

*Primary Examiner* — Chandrika Prasad
(74) *Attorney, Agent, or Firm* — Drinker Biddle & Reath LLP

(57) ABSTRACT

In a wiring substrate in which plural wiring layers and insulating layers are alternately stacked and the adjacent wiring layers are electrically connected through a via hole formed in the insulating layer, plural holes constructing substrate management information recognizable as a character, a symbol, etc. are formed in the outside insulating layer of the insulating layers.

8 Claims, 16 Drawing Sheets

WIRING SUBSTRATE WITH PLURALITY OF WIRING AND INSULATING LAYERS WITH A SOLDER RESIST LAYER COVERING A WIRING LAYER ON THE OUTSIDE OF OUTER INSULATING LAYER BUT EXPOSING THE HOLES IN THE OUTER INSULATING LAYER

TECHNICAL FIELD

The present disclosure relates to a wiring substrate in which substrate management information such as an identification number or coordinate information is formed, a manufacturing method of the wiring substrate and a semiconductor package.

RELATED ART

In recent years, a wiring substrate used for, for example, installation of a semiconductor chip becomes more downsized and denser and is handled in a form of a collectivized wiring substrate. FIG. 1 is a plan view illustrating a related-art collectivized wiring substrate 200. Referring to FIG. 1, the collectivized wiring substrate 200 has plural wiring substrates 100 and an outer frame 210 by which the plural wiring substrates 100 are surrounded. A shows a position (hereinafter called a "cut position A") in which the collectivized wiring substrate 200 is cut by a dicing blade etc. The collectivized wiring substrate 200 is individualized by being cut in the cut positions A and results in the wiring substrates 100. In this case, the outer frame 210 is the discarded portion.

Identification numbers of A1 to H8 are formed in the plural (64) wiring substrates 100. Such identification numbers are used in the case etc. where some trouble occurs in the wiring substrate 100 after individualization. For example, it can be pinpointed that the wiring substrate 100 in which the trouble occurs is arranged in any position of the collectivized wiring substrate 200, so that it can be analyzed that, for example, its trouble occurs by depending on a particular place in the collectivized wiring substrate 200 or occurs in connection with a particular process in a manufacturing step.

Also, coordinate information, a lot number, a serial number, a drawing number, a product name, etc. in addition to such identification numbers may be formed in the plural wiring substrates 100. Hereinafter, information including the identification numbers, the coordinate information, the lot number, the serial number, the drawing number, the product name, etc. is called substrate management information.

The substrate management information was formed using a wiring pattern (for example, see Patent Reference 1). Also, at the time of forming the wiring pattern, exposure is performed and a one-shot contact exposure method was adopted. The one-shot contact exposure method is an exposure method in which an exposure mask in which substrate management information etc. are previously formed is brought into close contact with an exposure object and the exposure object is irradiated with light through the exposure mask in its state and the substrate management information etc. formed in the exposure mask are transferred to the exposure object. By adopting the one-shot contact exposure method, one exposure is simply performed even when different substrate management information is respectively formed in each of the wiring substrates 100, so that a manufacturing cost of the collectivized wiring substrate 200 can be reduced low.

[Patent Reference 1] JP-A-2003-86735

However, in the one-shot contact exposure method, the exposure mask is brought into close contact with the exposure object, so that there was a problem that dirt exists between the exposure mask and the exposure object and a yield of the collectivized wiring substrate 200 decreases. Also, in a contact exposure device used in the one-shot contact exposure method, a position accuracy of exposure is not high, so that there was a problem of being difficult to be used in manufacture of the collectivized wiring substrate 200 in which the high-density wiring substrates 100 are collectivized.

In order to solve such problems, it is also contemplated to adopt a projection exposure method instead of the one-shot contact exposure method. In the projection exposure method, an exposure mask is not brought into close contact with an exposure object, so that dirt does not adhere to the exposure object and also a position accuracy of exposure is high, so that it is characterized in that the projection exposure method can also be used in manufacture of the collectivized wiring substrate 200 in which the high-density wiring substrates 100 are collectivized.

However, a lens aperture of a projection exposure device used in the projection exposure method is relatively small and an effective exposure region is narrow, so that the whole collectivized wiring substrate 200 cannot be exposed collectively. The whole collectivized wiring substrate 200 can be exposed by plural times, but in the case of respectively forming different substrate management information in each of the wiring substrates 100, an exposure mask must be replaced every exposure and there was a problem that a manufacturing cost of the collectivized wiring substrate 200 increases greatly. Also, exposure at the time of forming a wiring pattern is performed by the projection exposure method and thereafter exposure for only forming substrate management information can be performed by the one-shot contact exposure method, but there was similarly the problem that a manufacturing cost of the collectivized wiring substrate 200 increases greatly.

SUMMARY

Exemplary embodiments of the present invention provide a wiring substrate capable of coping with density growth and also forming substrate management information without a great increase in a manufacturing cost, a manufacturing method of the wiring substrate and a semiconductor package having the wiring substrate.

A first invention is a wiring substrate comprising a plurality of wiring layers and a plurality of insulating layers, which are alternately stacked, wherein the adjacent wiring layers are electrically connected through a via hole formed in the insulating layer, and wherein the outside insulating layer of the insulating layers has a plurality of holes constructing substrate management information. The substrate management information may be a character, or a symbol.

In the wiring substrate according to the first invention, a second invention is characterized in that the plurality of holes are through holes extending through the outside insulating layer.

In the wiring substrate according to the first invention, a third invention is characterized in that the plurality of holes have a concave shape.

In the wiring substrate according to the first or second invention, a fourth invention is characterized in that the wiring layer is exposed from the plurality of holes.

In the wiring substrate according to the first or second invention, a fifth invention is characterized in that an Au layer is exposed from the plurality of holes.

In the wiring substrate according to any one of the first to fifth inventions, a sixth invention is characterized in that the plurality of holes are formed so as not to overlap mutually in plan view.

A seventh invention is a semiconductor package comprising a wiring substrate according to any one of the first to sixth inventions and a semiconductor chip, wherein the semiconductor chip is installed in the side of the outside insulating layer of the wiring substrate.

An eighth invention is a manufacturing method of a wiring substrate in which a plurality of wiring layers and a plurality of insulating layers are alternately stacked and the adjacent wiring layers are electrically connected through a via hole formed in the insulating layer, the method comprising a hole formation step of forming a plurality of holes constructing substrate management information in the outside insulating layer of the insulating layers. The substrate management information may be a character, or a symbol.

In the manufacturing method of the wiring substrate according to the eighth invention, a ninth invention is characterized in that the hole formation step is performed at the same time as a via hole formation step of forming the via hole in the outside insulating layer.

In the manufacturing method of the wiring substrate according to the eighth or ninth inventions a tenth invention is characterized by further having a metal layer formation step of forming a metal layer having an Au layer on the wiring layer recognizable from the holes constructing substrate management information.

In the manufacturing method of the wiring substrate according to the tenth invention, an eleventh invention is characterized in that the metal layer formation step is a step of forming only an Au layer on the wiring layer.

In the manufacturing method of the wiring substrate according to the tenth invention, a twelfth invention is characterized in that the metal layer formation step is a step of sequentially stacking and forming an Ni layer and an Au layer on the wiring layer.

In the manufacturing method of the wiring substrate according to the tenth invention, a thirteenth invention is characterized in that the metal layer formation step is a step of sequentially stacking and forming an Ni layer, a Pd layer and an Au layer on the wiring layer.

According to the invention, a wiring substrate capable of coping with density growth and also forming substrate management information without a great increase in a manufacturing cost, a manufacturing method of the wiring substrate and a semiconductor package having the wiring substrate can be provided.

Other features and advantages may be apparent from the following detailed description, the accompanying drawings and the claims.

DETAILED DESCRIPTION

The best mode for carrying out the invention will hereinafter be described with reference to the drawings.

First Embodiment

Figure 1:
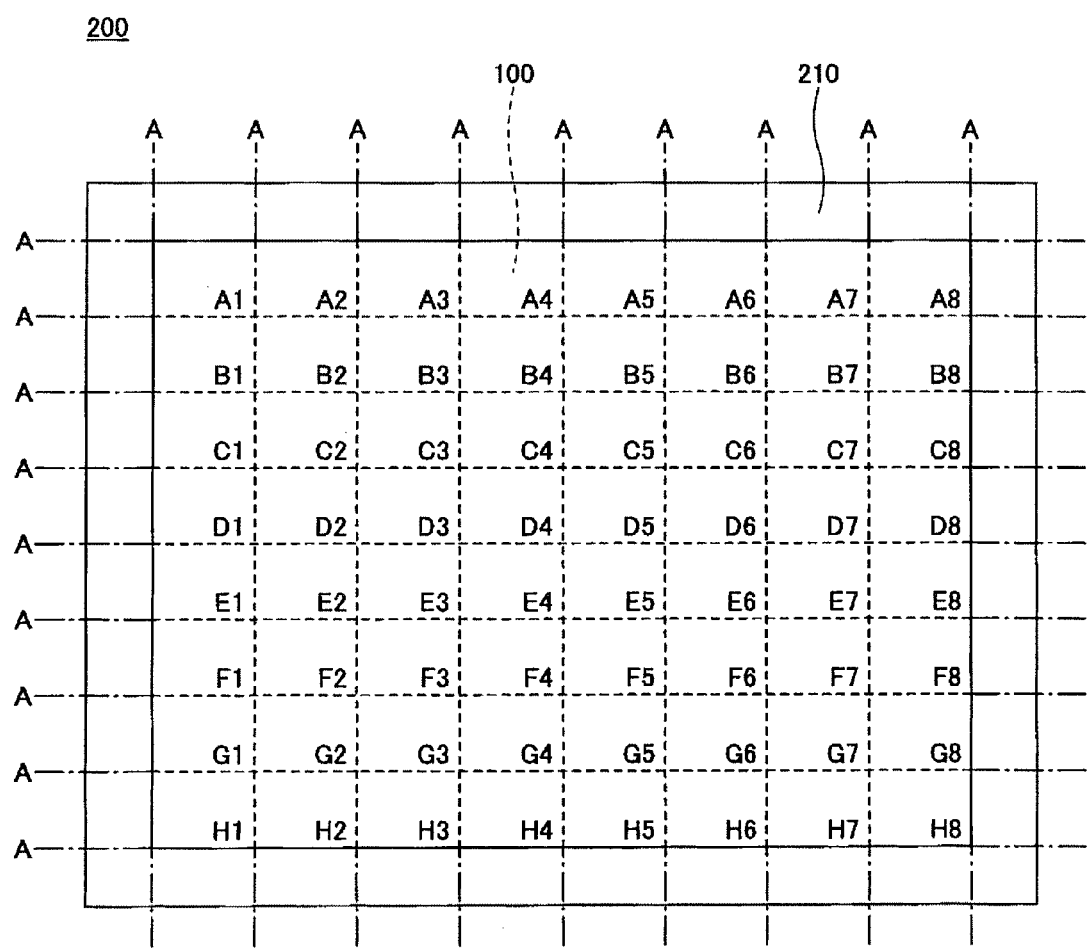
FIG. 1 is a plan view illustrating a related-art collectivized wiring substrate 200.
Figure 2:
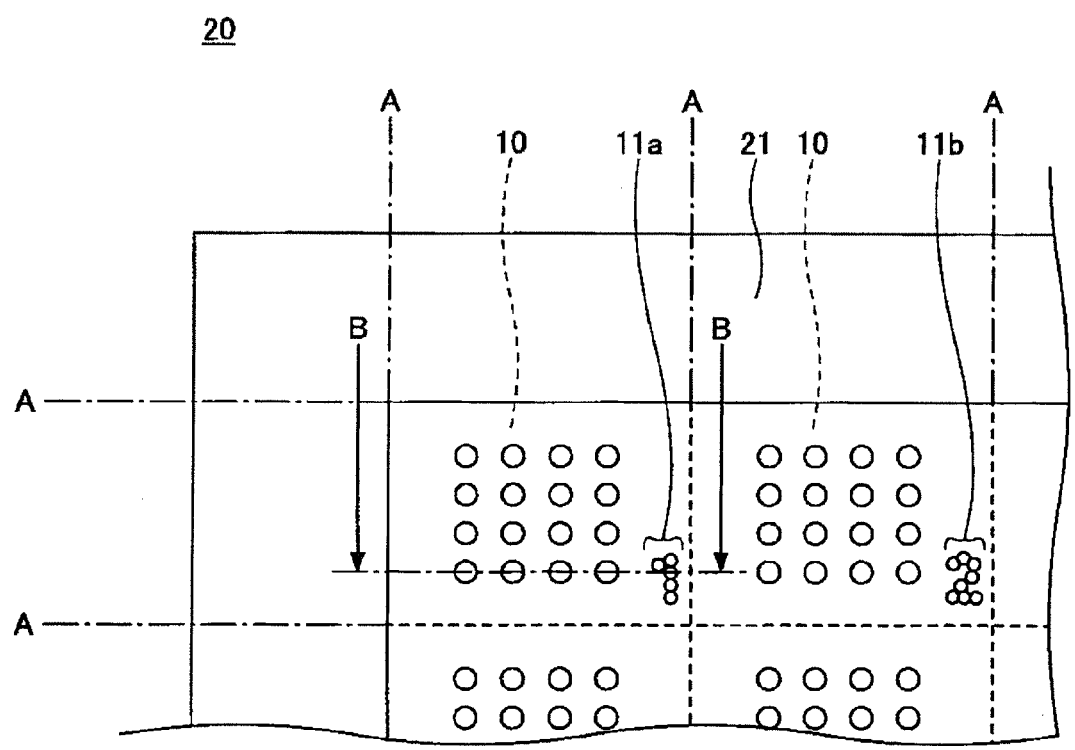
FIG. 2 is a plan view partially illustrating a collectivized wiring substrate 20 according to a first embodiment of the invention.
Figure 3:
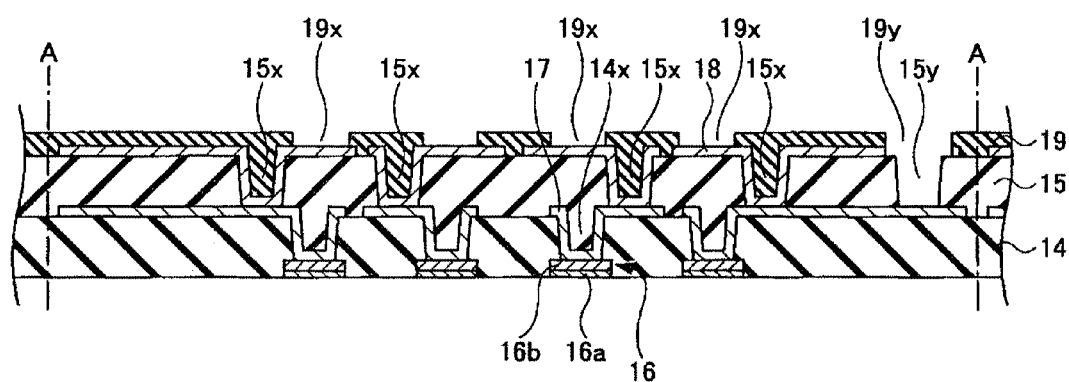
FIG. 3 is a sectional view taken along line B-B of FIG. 2 illustrating the collectivized wiring substrate 20 according to the first embodiment of the invention.

FIG. 2 is a plan view partially illustrating a collectivized wiring substrate 20 according to a first embodiment of the invention. FIG. 3 is a sectional view taken along line B-B of FIG. 2 illustrating the collectivized wiring substrate 20 according to the first embodiment of the invention.

Referring to FIG. 2, the collectivized wiring substrate 20 is constructed of plural wiring substrates 10 and an outer frame 21. A shows a position (hereinafter called a "cut position A") in which the collectivized wiring substrate 20 is cut by a dicing blade etc. The collectivized wiring substrate 20 is individualized by being cut in the cut positions A and results in the wiring substrates 10. In this case, the outer frame 21 is the discarded portion.

Substrate management information 11a indicating "1" or substrate management information 11b indicating "2" is respectively formed in the plural wiring substrates 10. The substrate management information is also respectively formed in the wiring substrates 10 (not shown in FIG. 2) constructing the collectivized wiring substrate 20. The substrate management information 11a, 11b, etc. are information such as an identification number, coordinate information, a lot number, a serial number, a drawing number or a product name as described above and are used in the case etc. where some trouble occurs in the wiring substrate 10 after individualization. In addition, the substrate management information 11a, 11b, etc. are simplified and depicted in FIG. 2.

Referring to FIG. 3, the collectivized wiring substrate 20 is a sheet-shaped collectivized wiring substrate which does not have a support body and has a first insulating layer 14, a second insulating layer 15, a first wiring layer 16, a second wiring layer 17, a third wiring layer 18 and a solder resist 19. The first insulating layer 14 is formed on the first wiring layer 16 and the second wiring layer 17 is formed on the first insulating layer 14. Further, the second insulating layer 15 is formed on the second wiring layer 17 and the third wiring layer 18 is formed on the second insulating layer 15.

The first wiring layer 16 is constructed of a surface plated layer 16a and a pad body 16b. The first wiring layer 16 functions as an electrode pad electrically connected to, for example, a semiconductor chip. The first wiring layer 16 is electrically connected to the second wiring layer 17 through a first via hole 14x formed in the first insulating layer 14. Also, the second wiring layer 17 is electrically connected to the third wiring layer 18 through a second via hole 15x formed in the second insulating layer 15.

In addition to the second via hole 15x for electrically connecting the second wiring layer 17 to the third wiring layer 18, a through hole 15y constructing the substrate management information is formed in the second insulating layer 15. The solder resist 19 is formed on the third wiring layer 18. The solder resist 19 has an opening part 19x on the third wiring layer 1 and has an opening part 19y on the through hole 15y. The portion corresponding to the opening part 19x of the third wiring layer 18 functions as an electrode pad electrically connected to, for example, a semiconductor chip.

Figure 17A:
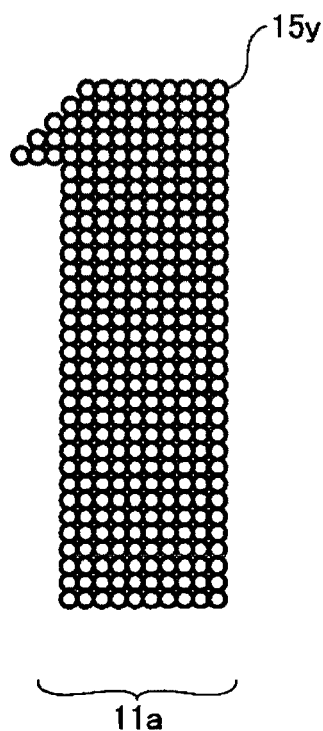
FIGS. 17A and 17B are plan views schematically illustrating substrate management information 11a "1" formed by plural through holes 15y.
Figure 17B:
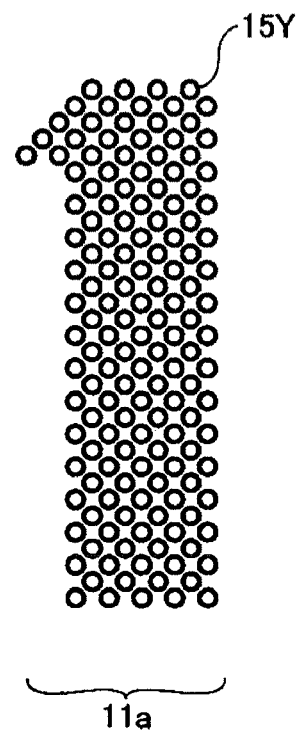

Thus, the insulating layer or the solder resist is not formed on the through hole 15y and the second wiring layer 17 is exposed from the through hole 15y and it is recognized as shown by "1" in plan view from an upper direction of the solder resist 19 (see FIGS. 17A and 17B).

Subsequently, a manufacturing method of the collectivized wiring substrate 20 will be described. FIGS. 4 to 16 are views illustrating a manufacturing step of the collectivized wiring substrate 20 according to the first embodiment of the invention. In FIGS. 4 to 16, the same numerals are assigned to the same components as those of FIGS. 2 and 3 and its description is omitted.

Figure 4:
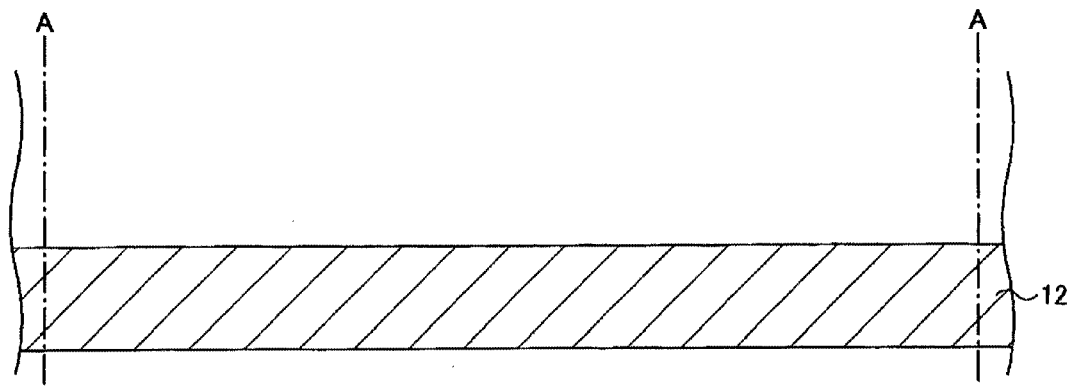
FIG. 4 is a view illustrating a manufacturing step of the collectivized wiring substrate 20 according to the first embodiment of the invention (first).
Figure 5:
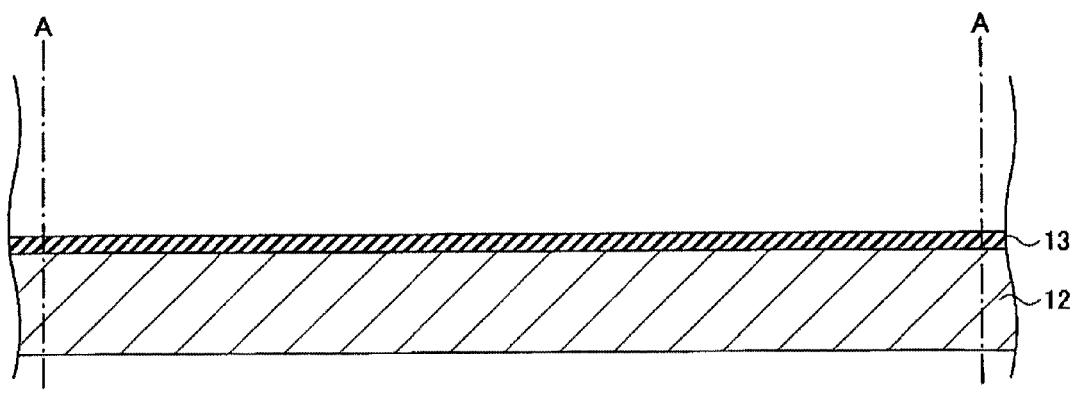
FIG. 5 is a view illustrating a manufacturing step of the collectivized wiring substrate 20 according to the first embodiment of the invention (second).

First, in a step shown in FIG. 4, a support body 12 is prepared. In the embodiment, Cu foil is used as the support body 12. A thickness of the Cu foil can be set at, for example, 35 to 100 μm. Next, in a step shown in FIG. 5, a resist film 13 is formed on the support body 12. As the resist film 13, for example, a dry film can be used.

Figure 6:
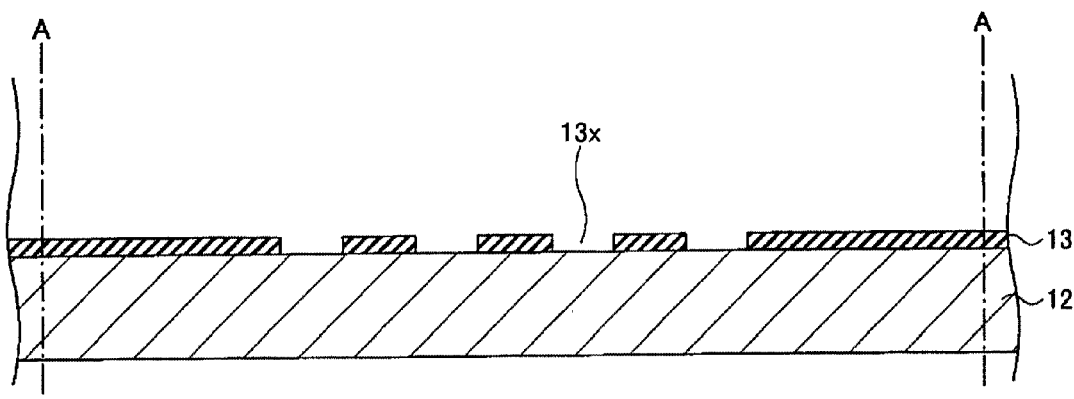
FIG. 6 is a view illustrating a manufacturing step of the collectivized wiring substrate 20 according to the first embodiment of the invention (third).

Then, in a step shown in FIG. 6, patterning processing such as exposure is performed with respect to the resist film 13 and an opening part 13x is formed in the portion corresponding to a formation position of a first wiring layer 16. In the exposure, for example, a projection exposure method can be used. In addition, the opening part 13x may be previously formed with respect to the dry-filmy resist film 13 and the resist film 13 in which the opening part 13x is formed may be disposed on the support body 12.

Figure 7:
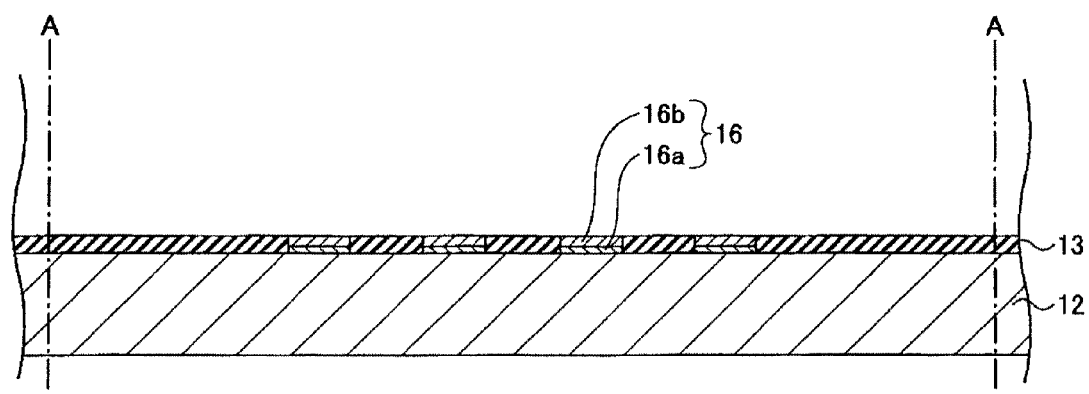
FIG. 7 is a view illustrating a manufacturing step of the collectivized wiring substrate 20 according to the first embodiment of the invention (fourth).
Figure 8:
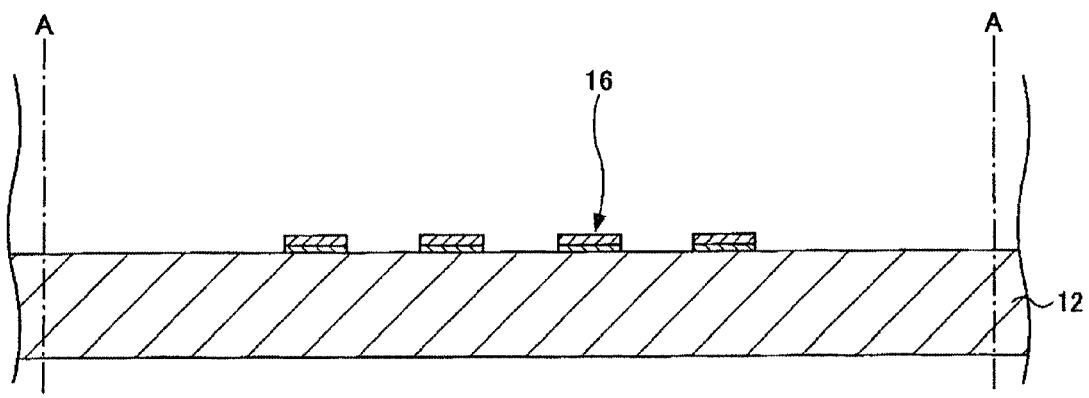
FIG. 8 is a view illustrating a manufacturing step of the collectivized wiring substrate 20 according to the first embodiment of the invention (fifth).

Then, in a step shown in FIG. 7, the first wiring layer 16 is formed on the support body 12 by an electrolytic plating method using the support body 12 in a plated power feeding layer. The first wiring layer 16 is formed inside the opening part 13x formed in the resist film 13 and is constructed of a surface plated layer 16a and a pad body 16b.

The surface plated layer 16a has a structure in which, for example, an Au layer, a Pd layer and an Ni layer ate stacked. In the case of forming the first wiring layer 16, the surface plated layer 16a is formed by sequentially plating, for example, the Au layer, the Pd layer and the Ni layer and subsequently the pad body 16b made of Cu etc. is formed on the surface plated layer 16a by plating. Then, in a step shown in FIG. 8, the resist film 13 shown in FIG. 7 is removed. In addition, the first wiring layer 16 functions as an electrode pad electrically connected to, for example, a semiconductor chip, PWB (printed-wiring board) or the like.

Figure 9:
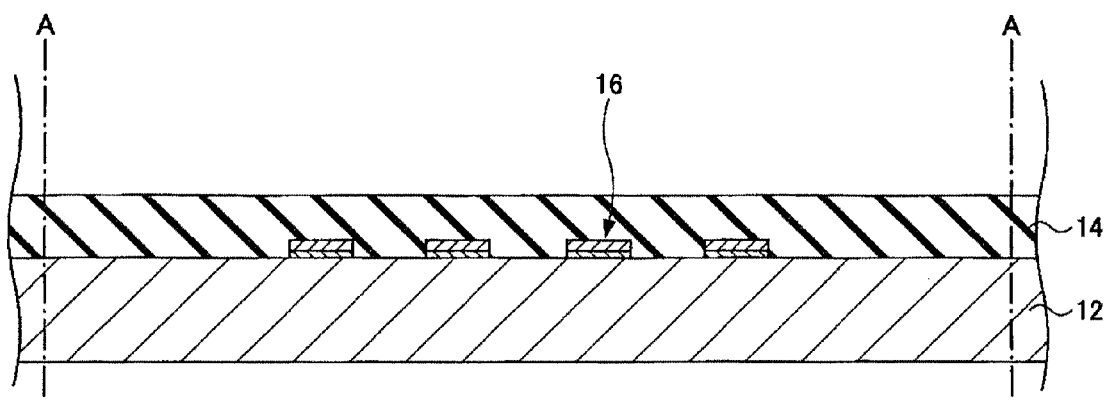
FIG. 9 is a view illustrating a manufacturing step of the collectivized wiring substrate 20 according to the first embodiment of the invention (sixth).

Then, in a step shown in FIG. 9, a first insulating layer 14 with which the first wiring layer 16 is covered is formed on the support body 12. As a material of the first insulating layer 14, a resin material such as an epoxy resin or a polyimide resin can be used. As one example of a formation method of the first insulating layer 14, after a resin film is provided to the support body 12, the resin film is pressed (pushed) and thereafter is cured by thermal treatment at a temperature of about 190° C. and thereby, the first insulating layer 14 can be obtained.

Figure 10:
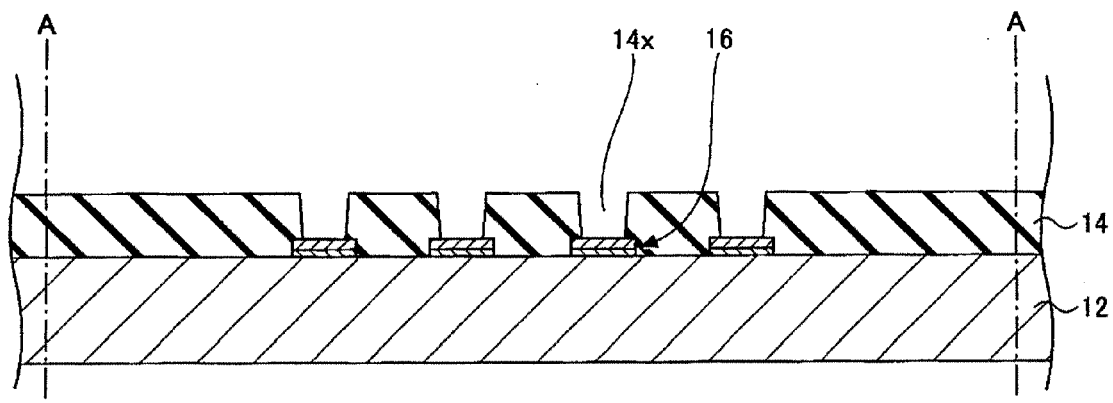
FIG. 10 is a view illustrating a manufacturing step of the collectivized wiring substrate 20 according to the first embodiment of the invention (seventh).

Then, in a step shown in FIG. 10, a first via hole 14x is formed in the first insulating layer 14 formed on the support body 12 so as to expose the first wiring layer 16 using a laser processing method. As a laser, for example, a $CO_2$ laser or a YAG laser can be used.

Figure 11:
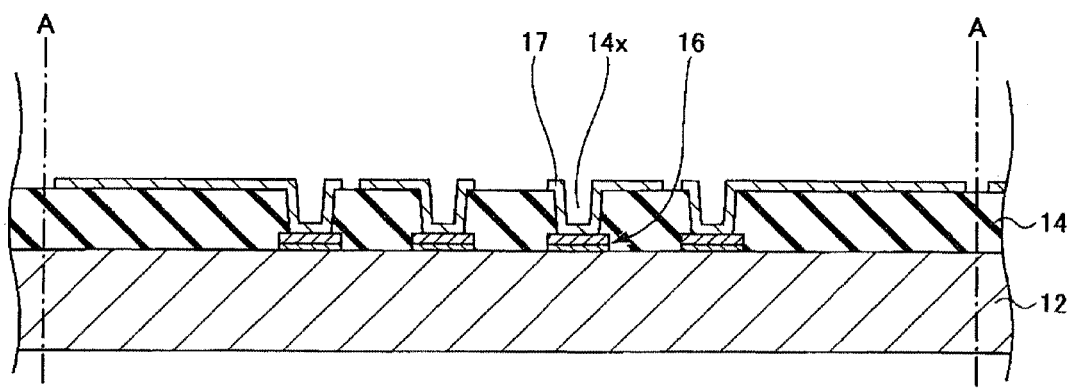
FIG. 11 is a view illustrating a manufacturing step of the collectivized wiring substrate 20 according to the first embodiment of the invention (eighth).

Then, in a step shown in FIG. 11, a second wiring layer 17 electrically connected to the first wiring layer 16 is formed on the first insulating layer 14 through the first via hole 14x. As the second wiring layer 17, for example, Cu can be used. The second wiring layer 17 is formed by, for example, a semi-additive method.

Referring more specifically to an example of forming the second wiring layer 17 by the semi-additive method, a Cu seed layer (not shown) is first formed on the first insulating layer 14 and inside the first via hole 14x by an electroless plating method or a sputtering method and thereafter a resist film (not shown) comprising an opening part corresponding to the second wiring layer 17 is formed. In exposure performed in this case, for example, a projection exposure method can be used. Next, a Cu layer pattern (not shown) is formed in the opening part of the resist film by an electrolytic plating method using the Cu seed layer in a plated power feeding layer.

Then, after the resist film is removed, the second wiring layer 17 is obtained by etching the Cu seed layer using the Cu layer pattern as a mask. In addition, as a formation method of the second wiring layer 17, various wiring formation methods such as a subtractive method in addition to the semi-additive method described above can be used.

Figure 12:
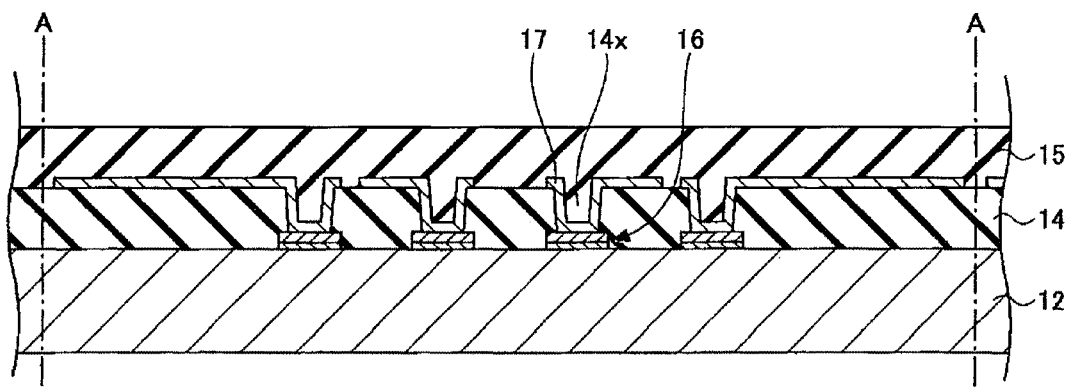
FIG. 12 is a view illustrating a manufacturing step of the collectivized wiring substrate 20 according to the first embodiment of the invention (ninth).

Then, in a step shown in FIG. 12, a second insulating layer 15 with which the second wiring layer 17 is covered is formed on the first insulating layer 14. As a material of the second insulating layer 15, a resin material such as an epoxy resin or a polyimide resin can be used. Since a formation method of the second insulating layer 15 is the same as the formation method of the first insulating layer 14, its description is omitted.

Figure 13:
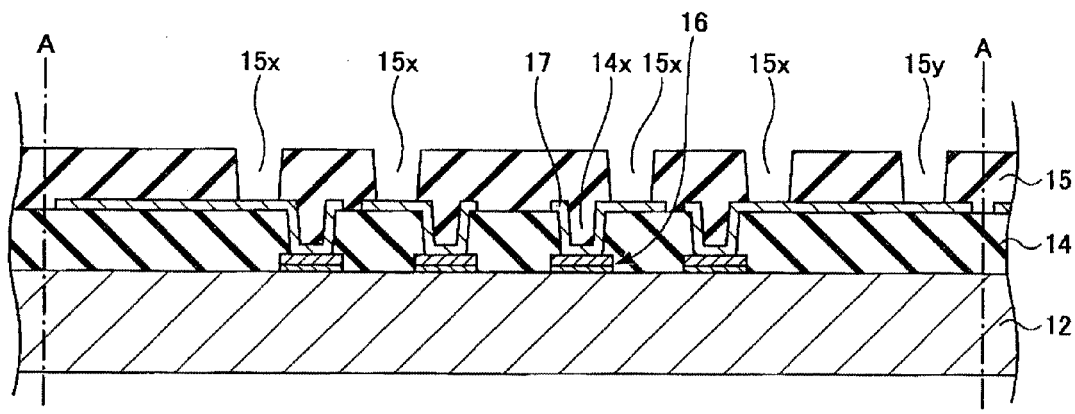
FIG. 13 is a view illustrating a manufacturing step of the collectivized wiring substrate 20 according to the first embodiment of the invention (tenth).

Then, in a step shown in FIG. 13, a second via hole 15x and a through hole 15y are formed in the second insulating layer 15 so as to expose the second wiring layer 17 using a laser processing method. As a laser, for example, a $CO_2$ laser or a YAG laser can be used. The plural through holes 15y are formed so as to be recognized as shown by "1" in plan view as the substrate management information 11a shown in FIG. 2. Examples of formation of the substrate management information 11a are shown in FIGS. 17A and 17B as one example.

FIGS. 17A and 17B are plan views schematically illustrating the substrate management information 11a "1" formed by the plural through holes 15y. In FIG. 2, the substrate management information 11a is simplified and depicted, and a diameter of the through hole 15y is about 60 μm to 150 μm and the through holes 15y must be formed collectively to some extent in order to be able to recognize the substrate management information. Therefore, the multiple through holes 15y are actually formed as shown in FIGS. 17A and 17B.

In this case, the through holes 15y may be formed so as to overlap or abut mutually as shown in FIG. 17A or the through holes 15y may be formed so as not to overlap mutually by being thinned out within a range capable of recognizing the substrate management information 11a as shown in FIG. 17B. Processing time of the through holes 15y can be reduced by thinning out the through holes 15y within the range capable of recognizing the substrate management information 11a and forming the through holes 15y.

Thus, the through holes 15y constructing the substrate management information 11a can be formed in the same step as a step of forming the second via hole 15x for electrically connecting the second wiring layer 17 to a third wiring layer 18.

In addition, laser processing time increases since the through holes 15y constructing the substrate management information 11a are formed, but it can cope in the same step as the step of forming the second via hole 15x. Therefore, a great increase in the processing time occurring in the case of forming the substrate management information in the related art that exposure at the time of forming a wiring pattern is performed by a projection exposure method and thereafter exposure for only forming the substrate management information is performed by a one-shot contact exposure method is not caused. A manufacturing cost of the collectivized wiring substrate 20 also does not increase greatly.

Here, an increase in the processing time of the case of performing exposure at the time of forming a wiring pattern by a projection exposure method and forming substrate management information by a method according to the invention is compared with an increase in the processing time of the case of performing exposure at the time of forming a wiring pattern by a projection exposure method and thereafter performing exposure for only forming substrate management information by a one-shot contact exposure method.

The case of forming substrate management information in each of the wiring substrates 10 of the collectivized wiring substrate 20 constructed of 120 wiring substrates 10 using an average of 232 through holes 15y with a diameter of about 80 μm is considered as one example. In this case, it is necessary to form 120×232=27840 through holes 15y as the whole collectivized wiring substrate 20. Since a speed at which the through holes 15y are formed by a laser processing method is about 400 holes per second, the speed becomes 27840÷400≅70 seconds and the processing time of the collectivized wiring substrate 20 increases by about 70 seconds.

On the other hand, an increase in the processing time of the case of performing exposure at the time of forming a wiring pattern by a projection exposure method and thereafter performing exposure for only forming substrate management information by a one-shot contact exposure method is considered. In this case, it takes about 10 minutes to make a change in setup from a projection exposure device to a one-shot contact exposure device and takes about 10 minutes to perform contact exposure and a total of about 20 minutes (=1200 seconds) are required.

In comparison between these, it becomes 1200 seconds÷70 seconds≅17 and according to the substrate management information formation method according to the invention, the increase in the processing time can be suppressed to about one-seventeenth as compared with the case of performing exposure at the time of forming the wiring pattern by the projection exposure method and thereafter performing exposure for only forming the substrate management information by the one-shot contact exposure method. As a result of that, a situation in which a manufacturing cost of the collectivized wiring substrate 20 increases greatly can be suppressed.

Figure 14:
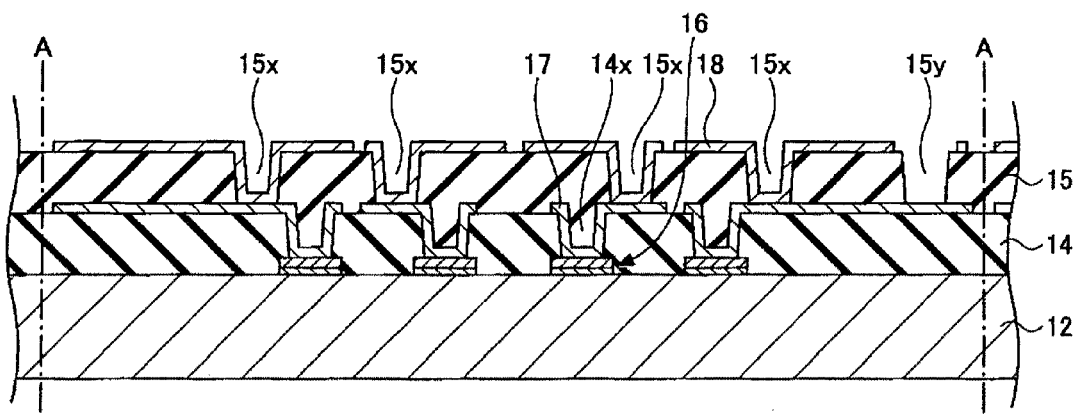
FIG. 14 is a view illustrating a manufacturing step of the collectivized wiring substrate 20 according to the first embodiment of the invention (eleventh).

Then, in a step shown in FIG. 14, a third wiring layer 18 electrically connected to the second wiring layer 17 is formed on the second insulating layer 15 through the second via hole 15x. As the third wiring layer 18, for example, Cu can be used. The third wiring layer 18 is formed by, for example, a semi-additive method. In exposure performed in this case, for example, a projection exposure method can be used.

Figure 15:
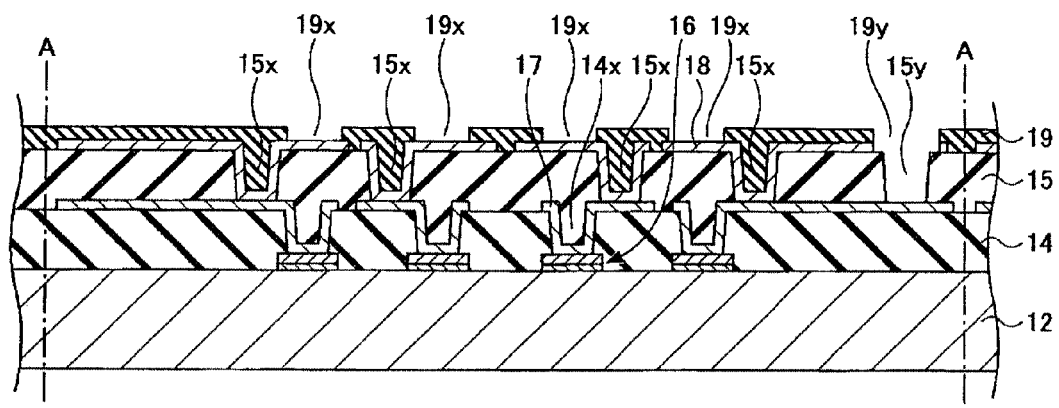
FIG. 15 is a view illustrating a manufacturing step of the collectivized wiring substrate 20 according to the first embodiment of the invention (twelfth).

Then, in a step shown in FIG. 15, a solder resist 19 is formed. A solder resist 19 has an opening part 19x disposed on a predetermined region of the third wiring layer 18 and an opening part 19y disposed on the through hole 15y. Consequently, the predetermined region of the third wiring layer 18 is exposed to the inside of the opening part 19x of the solder resist 19 and a predetermined region of the second wiring layer 17 is exposed to the inside of the opening part 19y of the solder resist 19. Ag plating, Sn plating, OSP (Organic Solderability Preservative) processing, etc. may be performed on a surface of Cu etc. constructing the third wiring layer 18 exposed to the inside of the opening part 19x of the solder resist 19 and a surface of Cu etc. constructing the second wiring layer 17 exposed to the inside of the opening part 19y of the solder resist 19.

The portion exposed to the inside of the opening part 19x of the third wiring layer 18 functions as an electrode pad electrically connected to, for example, a semiconductor chip. Also, the opening part 19y is formed in the portion corresponding to the through hole 15y, so that the second wiring layer 17 is exposed from the through hole 15y and it is recognized as shown by "1" in plan view from an upper direction of the solder resist 19 (see FIGS. 17A and 17B).

Thus, a predetermined build-up wiring layer is formed on the support body 12. In the embodiment, the build-up wiring layer of three layers (the first wiring layer 16, the second wiring layer 17 and the third wiring layer 18) is formed, but a build-up wiring layer of n layers (n is an integer of two or more) may be formed.

Figure 16:
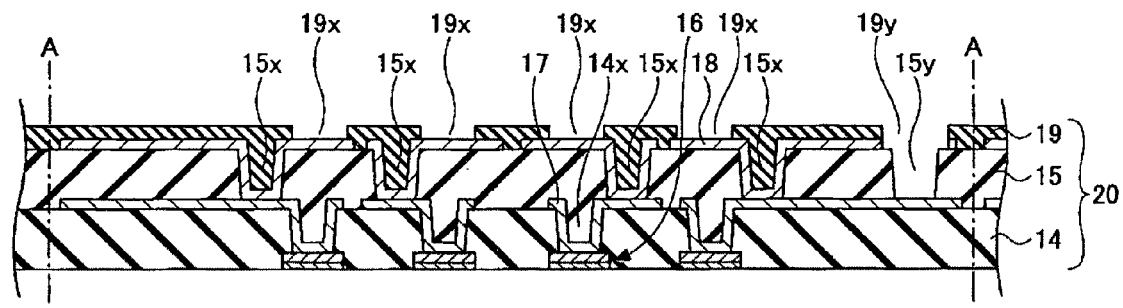
FIG. 16 is a view illustrating a manufacturing step of the collectivized wiring substrate 20 according to the first embodiment of the invention (thirteenth).

Then, in a step shown in FIG. 16, the support body 12 shown in FIG. 15 is removed. The support body 12 can be removed by wet etching using a ferric chloride aqueous solution, a cupric chloride aqueous solution or an ammonium persulfate aqueous solution, etc. after a masking film is stuck on the third wiring layer 18 exposed to the inside of the opening part 19x of the solder resist 19 and the second wiring layer 17 exposed to the inside of the opening part 19y. In this case, in the first wiring layer 16, the surface plated layer 16a is formed on the outermost surface, so that the support body 12 made of Cu can be removed by selectively etching the first insulating layer 14 and the first wiring layer 16. Consequently, the first wiring layer 16 is exposed from the first insulating layer 14.

Thus, the collectivized wiring substrate 20 according to the first embodiment of the invention is manufactured.

According to the collectivized wiring substrate 20 according to the first embodiment of the invention, substrate management information can be formed in the collectivized wiring substrate 20 without a great increase in a manufacturing cost by forming the through holes 15y constructing the substrate management information (for example, 11a) in the same step as a step of forming the via hole 15x in the second insulating layer 15 which is the outside insulating layer.

Also, a wiring layer can be formed by a projection exposure method with high position accuracy of exposure, so that it can also cope with manufacture of the collectivized wiring substrate 20 in which the high-density wiring substrates are collectivized.

Second Embodiment

Figure 18:
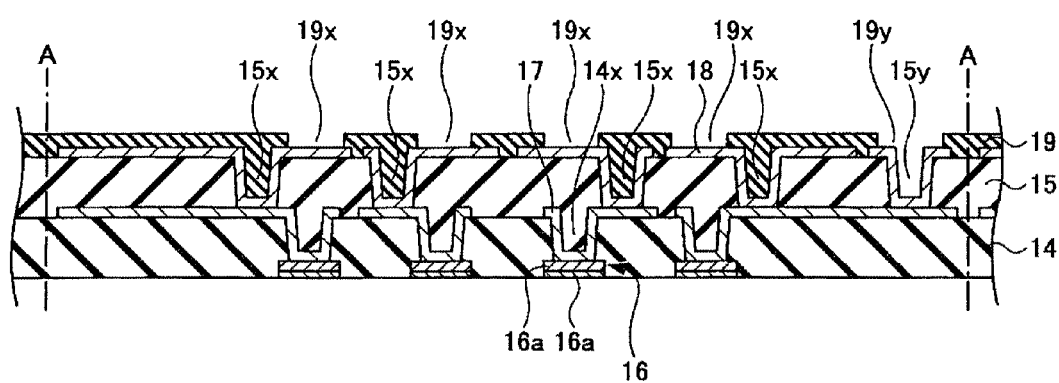
FIG. 18 is a sectional view illustrating a collectivized wiring substrate 30 according to a second embodiment of the invention.

FIG. 18 is a sectional view illustrating a collectivized wiring substrate 30 according to a second embodiment of the invention. Referring to FIG. 18, the collectivized wiring substrate 30 is constructed in a manner similar to the collectivized wiring substrate 20 except that a third wiring layer 18 in the collectivized wiring substrate 20 shown in FIG. 3 is also formed inside a through hole 15y constructing substrate management information.

A manufacturing method of the collectivized wiring substrate 30 is the same as the manufacturing method of the collectivized wiring substrate 20 shown in FIGS. 4 to 16 except for a step shown in FIG. 14. In a manufacturing step of the collectivized wiring substrate 30, the third wiring layer 18 is also formed inside the through hole 15y in a step corresponding to FIG. 14 of the collectivized wiring substrate 20.

As the third wiring layer 18, for example, Cu can be used. The third wiring layer 18 is formed by, for example, a semi-additive method. In addition, Ag plating, Sn plating, OSP (Organic Solderability Preservative) processing, etc. may be performed on surfaces of Cu etc. constructing the third wiring layer 18 exposed to the inside of an opening part 19x and an opening part 19y of a solder resist 19 after the solder resist 19 is formed in a step corresponding to FIG. 15 of the collectivized wiring substrate 20.

According to the collectivized wiring substrate 30 according to the second embodiment of the invention, substrate management information can be formed in the collectivized wiring substrate 30 without a great increase in a manufacturing cost in a manner similar to the collectivized wiring substrate 20 according to the first embodiment of the invention by forming the through holes 15y constructing the substrate management information (for example, 11a) in the same step as a step of forming a via hole 15x in a second insulating layer 15 which is the outside insulating layer.

Also, a wiring layer can be formed by a projection exposure method with high position accuracy of exposure, so that it can also cope with manufacture of the collectivized wiring substrate 30 in which high-density wiring substrates are collectivized.

Third Embodiment

Figure 19:
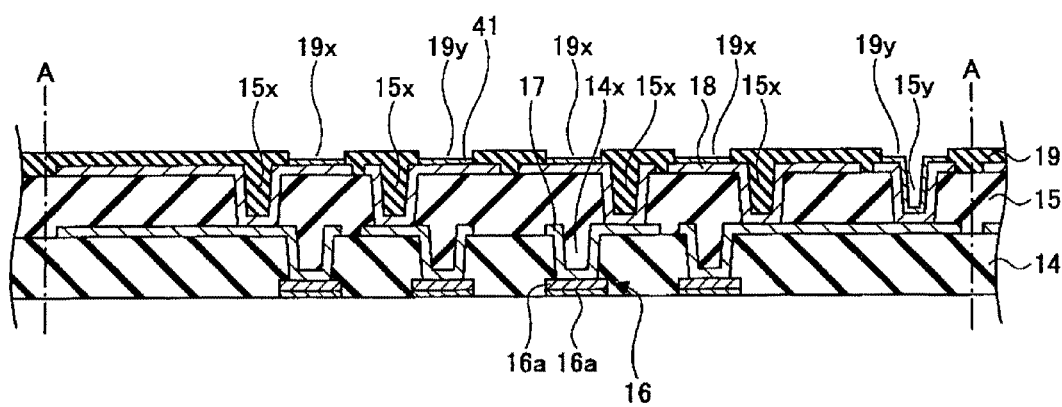
FIG. 19 is a sectional view illustrating a collectivized wiring substrate 40 according to a third embodiment of the invention.

FIG. 19 is a sectional view illustrating a collectivized wiring substrate 40 according to a third embodiment of the invention. Referring to FIG. 19, the collectivized wiring substrate 40 is constructed in a manner similar to the collectivized wiring substrate 30 except that a metal layer 41 is formed on a third wiring layer 18 exposed to the inside of an opening part 19x and an opening part 19y of a solder resist 19 in the collectivized wiring substrate 30.

A manufacturing method of the collectivized wiring substrate 40 is the same as the manufacturing method of the collectivized wiring substrate 20 shown in FIGS. 4 to 16 except for steps shown in FIGS. 14 and 15. In a manufacturing step of the collectivized wiring substrate 40, the third wiring layer 18 is also formed inside the through hole 15y in a step corresponding to FIG. 14 of the collectivized wiring substrate 20 in a manner similar to the case of the collectivized wiring substrate 30. As the third wiring layer 18, for example, Cu can be used. The third wiring layer 10 is formed by, for example, a semi-additive method.

Then, the metal layer 41 is formed on the third wiring layer 18 exposed to the inside of the opening part 19x and the opening part 19y of the solder resist 19 after the solder resist 19 is formed in a step corresponding to FIG. 15 of the collectivized wiring substrate 20. As the metal layer 41, an Au layer is directly formed on the third wiring layer 18 by an electrolytic plating method, an electroless plating method, etc. Also, for example, a structure in which an Ni layer and an Au layer are sequentially stacked on the third wiring layer 18 may be used. Also, a structure in which an Ni layer, a Pd layer and an Au layer are sequentially stacked on the third wiring layer 18 may be used. A thickness of the Au layer constructing the metal layer 41 can be set at, for example, 0.01 µm to 1 µm.

The purpose of forming the metal layer 41 on the third wiring layer 18 is to improve recognizability of substrate management information by exposing the Au layer from the through hole 15y constructing the substrate management information.

According to the collectivized wiring substrate 40 according to the third embodiment of the invention, substrate management information can be formed in the collectivized wiring substrate 40 without a great increase in a manufacturing cost in a manner similar to the collectivized wiring substrate 20 according to the first embodiment of the invention by forming the through holes 15y constructing the substrate management information (for example, 11a) in the same step as a step of forming a via hole 15x in a second insulating layer 15 which is the outside insulating layer.

Also, a wiring layer can be formed by a projection exposure method with high position accuracy of exposure, so that it can also cope with manufacture of the collectivized wiring substrate 40 in which high-density wiring substrates are collectivized.

Also, according to the collectivized wiring substrate 40 according to the third embodiment of the invention, by forming the third wiring layer 18 inside the through holes 15y and further forming the metal layer 41 on the third wiring layer 18 exposed to the inside of the opening part 19y of the solder resist 19, an Au layer is recognized from the through holes 15y constructing substrate management information, so that recognizability of the substrate management information can be improved.

Fourth Embodiment

Figure 20:
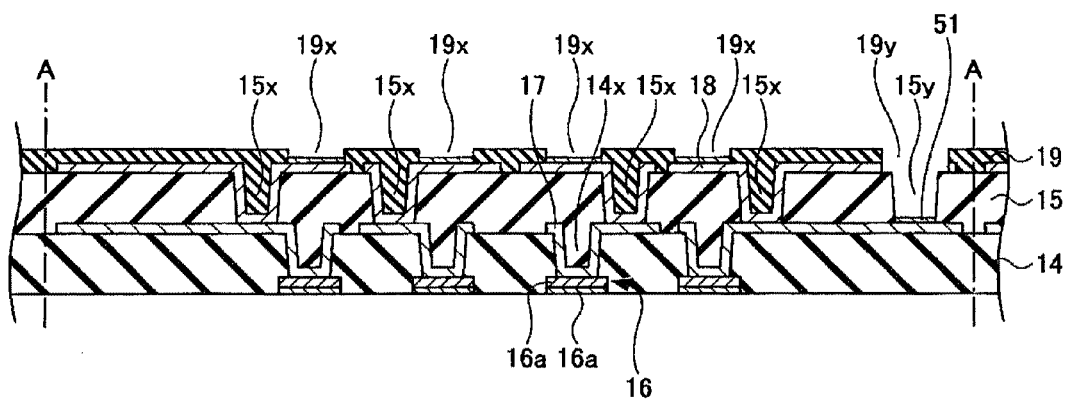
FIG. 20 is a sectional view illustrating a collectivized wiring substrate 50 according to a fourth embodiment of the invention.

FIG. 20 is a sectional view illustrating a collectivized wiring substrate 50 according to a fourth embodiment of the invention. Referring to FIG. 20, the collectivized wiring substrate 50 is constructed in a manner similar to the collectivized wiring substrate 20 except that a metal layer 51 is formed on a second wiring layer 17 exposed to the inside of an opening part 19y and a third wiring layer 18 exposed to the inside of an opening part 19x of a solder resist 19 in the collectivized wiring substrate 20.

A manufacturing method of the collectivized wiring substrate 50 is the same as the manufacturing method of the collectivized wiring substrate 20 shown in FIGS. 4 to 16 except for a step shown in FIG. 15. In a manufacturing step of the collectivized wiring substrate 50, the metal layer 51 is formed on the second wiring layer 17 exposed to the inside of the opening part 19y and the third wiring layer 18 exposed to the inside of the opening part 19x of the solder resist 19 after the solder resist 19 is formed in a step corresponding to FIG. 15 of the collectivized wiring substrate 20.

As the metal layer 51, an Au layer is directly formed on the second wiring layer 17 and the third wiring layer 18 by an electrolytic plating method, an electroless plating method, etc. Also, for example, a structure in which an Ni layer and an Au layer are sequentially stacked on the second wiring layer 17 and the third wiring layer 18 may be used. Also, a structure in which an Ni layer, a Pd layer and an Au layer are sequentially stacked on the second wiring layer 17 and the third wiring layer 18 may be used. A thickness of the Au layer constructing the metal layer 51 can be set at, for example, 0.01 μm to 1 μm.

The purpose of forming the metal layer 51 on the second wiring layer 17 is to improve recognizability of substrate management information by exposing the Au layer from the through hole 15y constructing the substrate management information.

According to the collectivized wiring substrate 50 according to the fourth embodiment of the invention, substrate management information can be formed in the collectivized wiring substrate 50 without a great increase in a manufacturing cost in a manner similar to the collectivized wiring substrate 20 according to the first embodiment of the invention by forming the through holes 15y constructing the substrate management information (for example, 11a) in the same step as a step of forming a via hole 15x in a second insulating layer 15 which is the outside insulating layer.

Also, a wiring layer can be formed by a projection exposure method with high position accuracy of exposure, so that it can also cope with manufacture of the collectivized wiring substrate 50 in which high-density wiring substrates are collectivized.

Also, according to the collectivized wiring substrate 50 according to the fourth embodiment of the invention, by forming the metal layer 51 on the second wiring layer 17 exposed to the inside of the opening part 19y of the solder resist 19, an Au layer is recognized from the through holes 15y constructing substrate management information, so that recognizability of the substrate management information can be improved.

Fifth Embodiment

Figure 21:
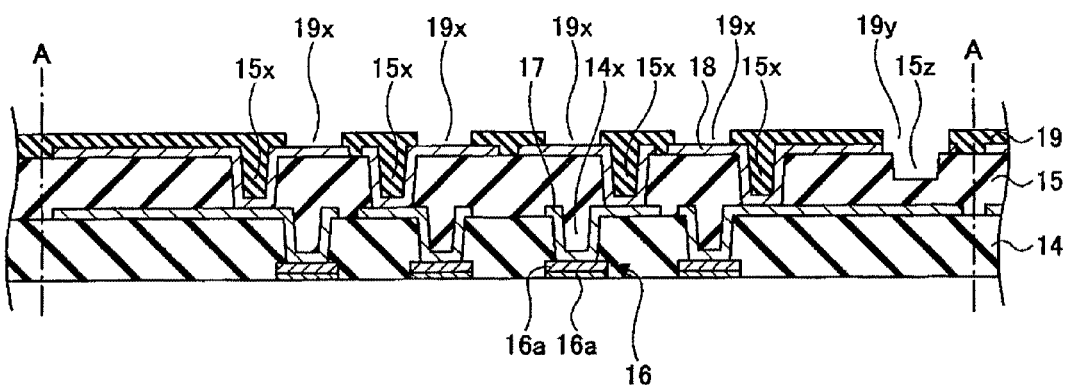
FIG. 21 is a sectional view illustrating a collectivized wiring substrate 60 according to a fifth embodiment of the invention.

FIG. 21 is a sectional view illustrating a collectivized wiring substrate 60 according to a fifth embodiment of the invention. Referring to FIG. 21, the collectivized wiring substrate 60 is constructed in a manner similar to the collectivized wiring substrate 20 except that a concave hole 15z is formed instead of the through hole 15y in the collectivized wiring substrate 20.

A manufacturing method of the collectivized wiring substrate 60 is the same as the manufacturing method of the collectivized wiring substrate 20 shown in FIGS. 4 to 16 except for a step shown in FIG. 13. In a manufacturing step of the collectivized wiring substrate 60, the concave hole 15z is formed in a step corresponding to FIG. 13 of the collectivized wiring substrate 20 and unlike the through hole 15y, the concave hole 15z does not reach a second wiring layer 17 and is stopped inside a second insulating layer 15. The concave hole 15z can be formed in, for example, a depth about one-half of a thickness of the second insulating layer 15.

The concave hole 15z is formed by a laser processing method using, for example, a $CO_2$ laser or a YAG laser. The concave hole 15z can be formed in any depth by adjusting power of the laser. Since the second wiring layer 17 is not exposed from the concave hole 15z, the insulating layer 15 is recognized as shown by "1" in plan view from an upper direction of a solder resist 19 (see FIGS. 17A and 17B).

According to the collectivized wiring substrate 60 according to the fifth embodiment of the invention, substrate management information can be formed in the collectivized wiring substrate 60 without a great increase in a manufacturing cost in a manner similar to the collectivized wiring substrate 20 according to the first embodiment of the invention by forming the concave hole 15z, constructing the substrate management information (for example, 11a) in the same step as a step of forming a via hole 15x in the second insulating layer 15 which is the outside insulating layer.

Also, a wiring layer can be formed by a projection exposure method with high position accuracy of exposure, so that it can also cope with manufacture of the collectivized wiring substrate 60 in which high-density wiring substrates are collectivized.

Also, according to the collectivized wiring substrate 60 according to the fifth embodiment of the invention, by forming the concave hole 15z so as not to expose the second wiring layer 17, the second wiring layer 17 positioned under the concave hole 15z in plan view can be laid out freely.

Sixth Embodiment

Figure 22:
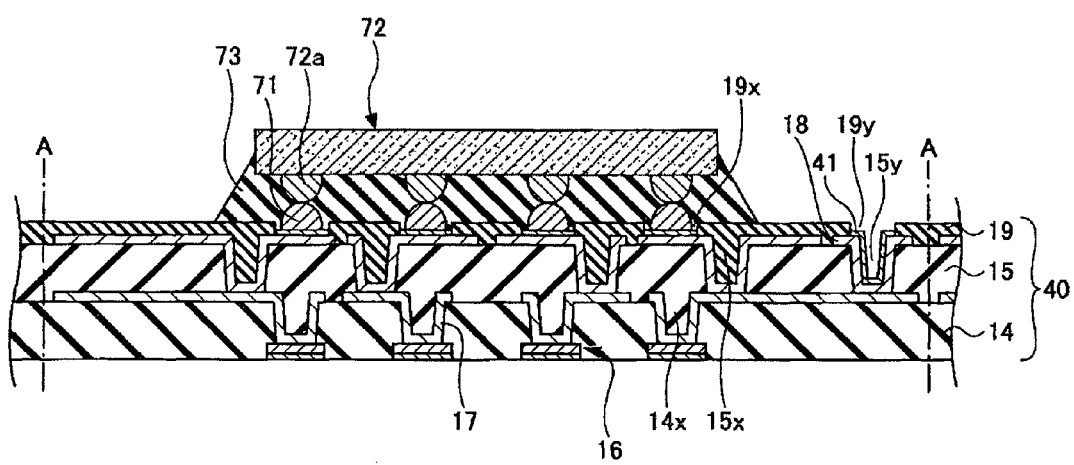
FIG. 22 is a sectional view illustrating a semiconductor package 70 in which a semiconductor chip 72 is installed in the collectivized wiring substrate 40 shown in FIG. 19.

FIG. 22 is a sectional view illustrating a semiconductor package 70 in which a semiconductor chip 72 is installed in the collectivized wiring substrate 40 shown in FIG. 19. Referring to FIG. 22, the semiconductor package 70 has the collectivized wiring substrate 40, solder bumps 71, the semiconductor chip 72 and an underfill resin 73. Ball-shaped terminals 72a which are electrodes are formed in the semiconductor chip 72.

The solder bumps 71 (bonded metals) are formed in the portion corresponding to opening parts 19x of a metal layer 41 of the collectivized wiring substrate 40. The ball-shaped terminals 72a of the semiconductor chip 72 are electrically connected to the solder bumps 71 of the collectivized wiring substrate 40. A gap between the semiconductor chip 72 and a solder resist 19 is filled with the underfill resin 73.

In the collectivized wiring substrate 40, an opening part 19y is formed in the portion corresponding to a through hole 15y and an Au layer constructing the metal layer 41 is exposed from the through hole 15y, so that the through holes 15y are recognized as shown by "1" in plan view from an upper direction of the solder resist 19 in the semiconductor package 70 (see FIGS. 17A and 17B).

Figure 23:
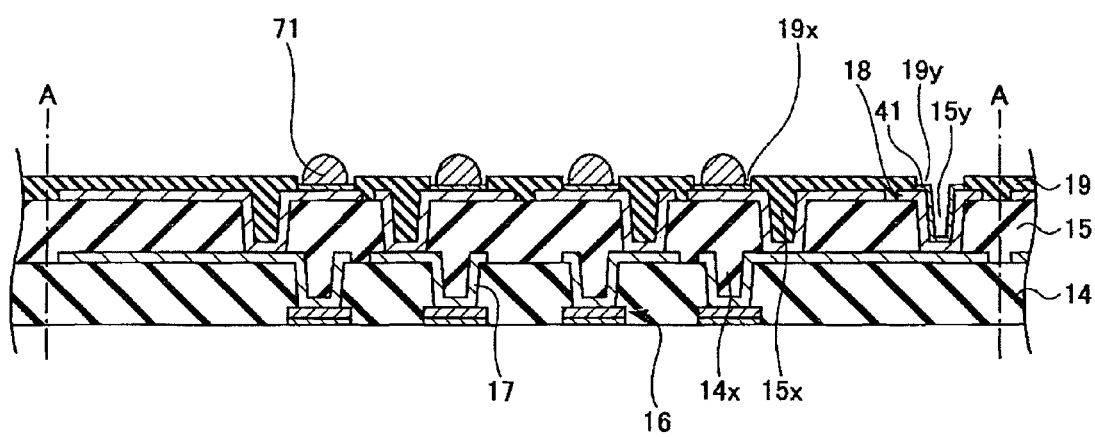
FIG. 23 is a view illustrating a manufacturing step of the semiconductor package 70 according to a sixth embodiment of the invention (first).
Figure 24:
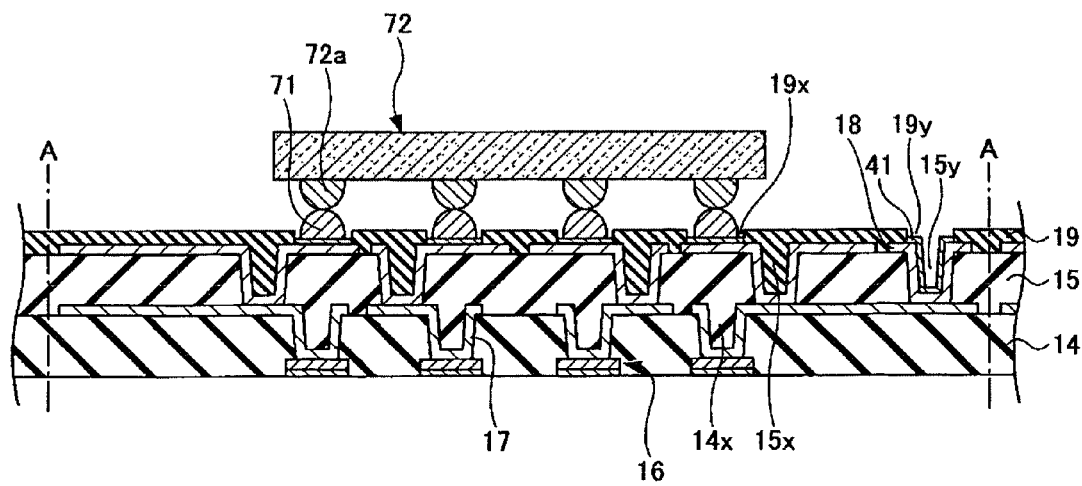
FIG. 24 is a view illustrating a manufacturing step of the semiconductor package 70 according to the sixth embodiment of the invention (second).
Figure 25:
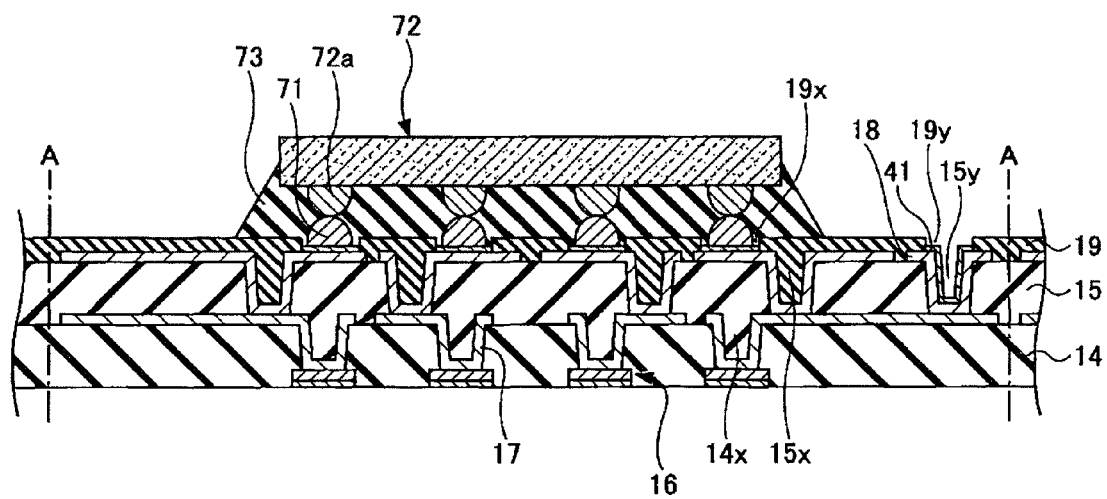
FIG. 25 is a view illustrating a manufacturing step of the semiconductor package 70 according to the sixth embodiment of the invention (third).

FIGS. 23 to 25 are views illustrating a manufacturing step of the semiconductor package 70 according to the sixth embodiment of the invention. In FIGS. 23 to 25, the same numerals are assigned to the same components as those of FIG. 22 and its description is omitted. First, in a step shown in FIG. 23, solder bumps 71 (bonded metals) are formed in the portion corresponding to opening parts 19x of a metal layer 41. The solder bumps 71 are obtained by applying a solder paste to the portion corresponding to the opening parts 19x of the metal layer 41 and performing reflow processing. Solder balls may be installed in the portion corresponding to the opening parts 19x of the metal layer 41.

Next, in a step shown in FIG. 24, a semiconductor chip 72 in which ball-shaped terminals 72a which are electrodes are formed is prepared and the ball-shaped terminals 72a of the semiconductor chip 72 are electrically connected to the solder bumps 71 of the collectivized wiring substrate 40 by heating to, for example, 190° C. and melting solder. Then, in a step shown in FIG. 25, a gap between the semiconductor chip 72 and a solder resist 19 is filled with an underfill resin 73.

Thus, the semiconductor package 70 in which the semiconductor chip 72 is mounted in the sheet-shaped collectivized wiring substrate 40 is manufactured. Thereafter, the individualized semiconductor package is completed by cutting the collectivized wiring substrate 40 in cut positions A by a dicing blade etc.

According to the semiconductor package 70 according to the sixth embodiment of the invention, the semiconductor package 70 in which substrate management information is formed can be implemented without a great increase in a manufacturing cost by installing the semiconductor chip 72 in the collectivized wiring substrate 40 in which the through holes 15y constructing the substrate management information (for example, 11a) are formed in the same step as a step of forming a via hole 15x in a second insulating layer 15 which is the outside insulating layer.

The preferred embodiments of the invention have been described above in detail, but the invention is not limited to the embodiments described above, and various modifications and replacements can be made in the embodiments described above without departing from the scope of the invention.

For example, in the collectivized wiring substrate 20 according to the first embodiment of the invention, the solder resist 19 has not been formed in the portion of the through hole 15y, but the solder resist 19 may be formed so as to bury the through hole 15y.

Also, in each of the embodiments of the invention, the case of applying the invention to the wiring substrate without having the support substrate has been shown, but the invention can similarly be applied to a wiring substrate having a support substrate.

Also, in the semiconductor package 70 according to the sixth embodiment of the invention, the case of installing the semiconductor chip 72 in the collectivized wiring substrate 40 according to the invention has been shown, but the semiconductor chip 72 may be installed in the collectivized wiring substrates 20, 30, 50, 60 according to the invention.

What is claimed is:

1. A wiring substrate comprising:
    a plurality of wiring layers and a plurality of insulating layers, which are alternately stacked,
    wherein adjacent wiring layers are electrically connected through a via hole formed in one of the insulating layers, and
    wherein an outside insulating layer of the insulating layers has a plurality of holes constructing substrate management information, and
    wherein a solder resist is formed on the outside insulating layer, the solder resist covering a wiring layer stacked on the outside insulating layer and exposing the plurality of holes.

2. A wiring substrate as claimed in claim 1, wherein the plurality of holes are through holes extending through the outside insulating layer.

3. A wiring substrate as claimed in claim 1, wherein each of the plurality of holes has a concave shape and is not filled.

4. A wiring substrate as claimed in claim 1, wherein the wiring layer is exposed from the plurality of holes.

5. A wiring substrate as claimed in claim 1, wherein an Au layer is exposed from the plurality of holes.

6. A wiring substrate as claimed in claim 1, wherein the plurality of holes are formed so as not to overlap mutually in plan view.

7. A wiring substrate as claimed in claim 1, wherein the substrate management information is a character or a symbol.

8. A semiconductor package comprising:
    a wiring substrate as claimed in claim 1; and
    a semiconductor chip,
    wherein the semiconductor chip is installed in the side of the outside insulating layer of the wiring substrate.

* * * * *